United States Patent
Reimann

(10) Patent No.: US 6,640,424 B1
(45) Date of Patent: Nov. 4, 2003

(54) DEVICE FOR HOLDING A GRIPPER FOR AN ELECTRICAL COMPONENT ON A FITTING HEAD

(75) Inventor: Guenter Reimann, Munich (DE)

(73) Assignee: Siemens Aktiengesellschaft, Münich (DE)

(*) Notice: Subject to any disclaimer, the term of this patent is extended or adjusted under 35 U.S.C. 154(b) by 0 days.

(21) Appl. No.: 10/129,770

(22) PCT Filed: Nov. 8, 2000

(86) PCT No.: PCT/DE00/03905

§ 371 (c)(1),
(2), (4) Date: May 8, 2002

(87) PCT Pub. No.: WO01/35711

PCT Pub. Date: May 17, 2001

(30) Foreign Application Priority Data

Nov. 9, 1999 (DE) .................................. 199 53 880

(51) Int. Cl.⁷ ............................. B25J 15/06; B25J 15/04
(52) U.S. Cl. ........................ 29/743; 29/453; 403/326; 294/64.1; 279/22; 279/30; 279/905
(58) Field of Search ..................... 29/743, 453, 464, 29/466; 403/322.2, 326, 324; 294/64.1, 64.2; 279/3, 22–24, 29–30, 76, 904, 905

(56) References Cited

U.S. PATENT DOCUMENTS

| | | | | | |
|---|---|---|---|---|---|
| 4,225,263 | A | * | 9/1980 | Asberg | 403/326 |
| 4,781,487 | A | * | 11/1988 | Greco | 403/326 |
| 5,758,410 | A | * | 6/1998 | Asai et al. | 29/740 |
| 5,797,696 | A | * | 8/1998 | Baynes et al. | 403/326 |
| 5,807,221 | A | | 9/1998 | Yi | |
| 6,161,886 | A | * | 12/2000 | Furuya et al. | 294/64.1 |
| 2002/0032960 | A1 | * | 3/2002 | Lee | 29/743 |
| 2002/0046461 | A1 | * | 4/2002 | Oe | 29/743 |
| 2002/0083584 | A1 | * | 7/2002 | Isogai et al. | 29/743 |

FOREIGN PATENT DOCUMENTS

| | | |
|---|---|---|
| JP | 2-067799 | 3/1990 |
| JP | 6-196896 | 7/1994 |
| JP | 6-335888 | 12/1994 |

* cited by examiner

Primary Examiner—A. L. Wellington
Assistant Examiner—Erica E Cadugan
(74) Attorney, Agent, or Firm—Schiff Hardin & Waite

(57) ABSTRACT

The invention provides a gripper that is plugged onto a rotatable shaft with a flat locating groove in which the caps of locating spheres engage, these locating spheres being peripherally distributed in an annular groove of the shaft. As a result, the gripper is held precisely on the shaft and can be replaced without causing significant wear.

8 Claims, 1 Drawing Sheet

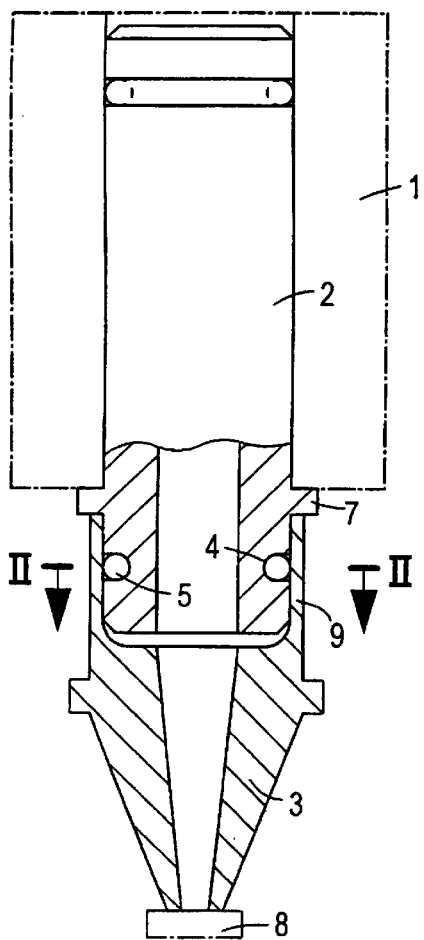
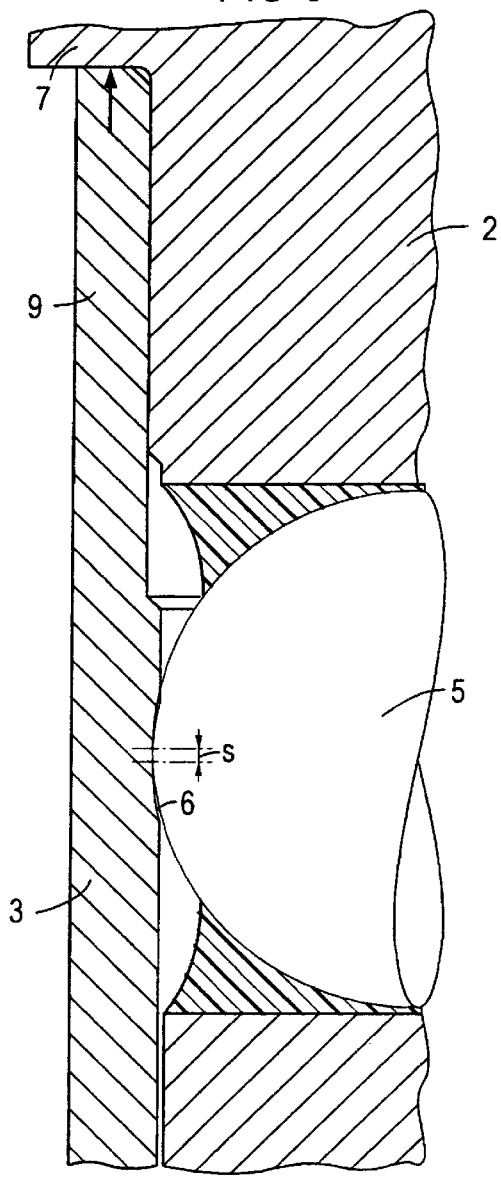
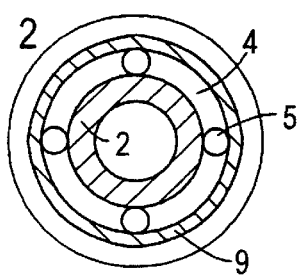

DEVICE FOR HOLDING A GRIPPER FOR AN ELECTRICAL COMPONENT ON A FITTING HEAD

BACKGROUND OF THE INVENTION

1. Field of the Invention

The invention relates to a device for holding a gripper for an electrical component on a fitting head, where the gripper can be fitted detachably to an end section of a substantially cylindrical shaft of the fitting head.

2. Description of the Related Art

It was previously common to plug grippers designed as suction pipettes and having a hollow cylindrical centering section onto a cylindrical end, section of a rotatable shaft of the fitting head. In such configurations, a flat annular locating groove is let into the inner side of the socket section. An elastomeric O-ring is inserted into an outwardly open annular groove of the shaft and engages under tension in the locating groove. The annular groove and the locating groove are offset axially to such an extent that the gripper is pressed in the axial direction against a stop on the shaft, as a result of which the gripper axis and the shaft axis are aligned parallel to each other. A short centering section of the gripper bears with a close fit on a corresponding cylindrical section of the shaft; this centers the gripper in the radial direction on the shaft.

A pipette axis angular deviation from the shaft axis impairs the circular running of the pipette tip holding a component. Before being placed on a printed circuit board, the component has to be rotated from a fetching position into a placement position, making possible a corresponding lateral offset. For very small components, eccentricity of the pipette tip can lead to these elements being sucked up eccentrically and drawn up into the suction channel, thus disrupting the pneumatic functioning of the fitting head.

The O-ring has relatively large production tolerances, which lead to the plug-on and pull-off forces varying over a wide range. Since the grippers have to be changed relatively frequently, depending on the components to be gripped, the O-ring has to be regreased frequently and carefully (with considerable expenditure on maintenance) in order to avoid correspondingly high frictional wear. Even the carefully maintained O-ring is subjected to residual wear, which necessitates periodic replacement. Since the frequency of change of the individual pipettes cannot be monitored automatically, it is also correspondingly difficult to coordinate the maintenance intervals in such a way that the pressing function is fulfilled reliably at any time, so that an angular deviation between the axes of the shaft and of the suction pipette cannot always be avoided.

Japanese patent document JP 2067799 A discloses a holding device for fixing a suction pipette to a fitting head, which has a hollow cylindrical centering socket, permitting insertion of a convex cylindrical connecting pin of the suction pipette. The connecting pin has an annular groove, in which radially deflectable locating spheres belonging to the fitting head engage and, in the event of a pipette change, are released by pushing a clamping bush back. An active locating mechanism of this type requires a relatively high mechanical outlay, with a correspondingly large external diameter in the area of the holding section. The requisite slimness of the pipette can be achieved only by lengthening it, but this results in a further removal of the pipette tip from the holding section, which reduces its positional accuracy.

SUMMARY OF THE INVENTION

The invention is based on the object of permitting secure and accurate fixing of the gripper on the shaft with little outlay on production and maintenance.

This object is achieved by a device for holding a gripper for an electrical component on a fitting head, comprising:

a substantially cylindrical shaft of the fitting head, comprising a locator configured to project radially from the shaft and configured as peripherally distributed fixed short locating caps relatively permanently connected to the shaft, the shaft configured to accept the gripper fixed detachably to an end section of the shaft in an axial direction; and a stop against which the gripper is pressed in the axial direction;

the gripper further comprising a hollow cylindrical centering section in an area of the shaft and resting on the shaft; and an annular locating groove located close to the centering section, the groove configured to engage the shaft locator, and the groove being offset axially from the locator when the gripper is pressed in the axial direction against the stop of the shaft.

The locating caps can be arranged in a precisely defined position and dimension on the shaft. They can have an abrasion-resistant and smooth surface, which is subject to low wear. The depth of the locating groove is so low that the required mutual deflection lies in the range of elastic compliance. In particular, the axial offset between the locating groove and the locating caps can be defined to a precise extent, so that the axial pressing forces can be limited considerably more accurately. The plug-on and pull-off forces can likewise be limited to a closer tolerance band, resulting in a reduction in the average actuation force.

The locating caps may be designed as spherical domes. These locating can be configured to result in point-like contact between the shaft and the gripper, which benefits the mutual deflection during location.

The invention may also comprise a shaft annular groove of the shaft and metallic locating spheres configured to be inserted into and affixed to the shaft annular groove, the locating spheres having locating caps formed on them. This annular groove may be formed exactly concentrically with the cylindrical centering section, so that the metal spheres can be arranged precisely in their radially installed position.

These locating spheres may be designed as steel spheres for ball bearings and may be configured to be fixed in the annular groove. This can be obtained cost-effectively as standard parts of high accuracy, high strength, and good sliding characteristics are available. As a result of lining the entire annular groove, the spheres may be firmly connected to the shaft, possibly using an adhesive bonding. This material may be of such a viscous consistency that it adheres in the annular groove without any further aid before being cured. The locating spheres can be inserted into this material by simply being pressed in. A sealing material (e.g., silicon rubber) may also be provided to line the annular groove.

The inventive device may further comprise a socket-like annular wall of the gripper in a fixing area configured to engage around the shaft from outside, a wall thickness of the annular wall being so low that it deforms under stress of the locating caps to form a round corner. The gripper wall can be bent out of its cylindrical shape to such an extent that sufficient compliance can be achieved without permanent deformation during the locating operation. It is particularly beneficial in this case if between three and five spheres are distributed in the annular groove. This results in secure centering with adequate compliance.

DESCRIPTION OF THE DRAWINGS

The invention is explained in more detail below using an exemplary embodiment illustrated in the drawings.

FIG. 1 is a longitudinal section through a fitting head having a shaft and a gripper;

FIG. 2 is a cross section along the line II—II in FIG. 1; and

FIG. 3 is a section showing an enlarged detail through the parts from FIG. 1 in the area of the section of FIG. 2.

DETAILED DESCRIPTION OF THE INVENTION

According to FIGS. 1, 2 and 3, a moveable gripper (fitting head) 1 for an electrical component 8 is provided with a vertical, substantially cylindrical shaft 2 at whose lower end a gripper 3 designed as a suction pipette is replaceably held. The shaft 2 is plugged by a thin-walled socket section onto the lower end of the shaft 2. The lower end of the shaft 2 has an annular groove 4 whose depth is somewhat less than the diameter of locating spheres 5 distributed peripherally in the annular groove 4. The inner part of the annular groove 4 has a rounded cross section and has a slightly greater radius than the locating spheres that permits secure contact in the base of the groove.

According to FIG. 3, a peripheral locating groove 6 is formed in the inner wall of the socket section of the gripper 3, at the level of the annular groove 4, within which groove 6 a locator, exemplified by locating spheres 5, engage with their outer caps. The annular groove 4 is offset in an axial direction with respect to the locating groove 6, by an amount s, to such an extent that the upper end of the gripper 3 can be pressed against a peripheral collar-like stop 7 of the shaft 2. A centering section 9 extents between the stop 7 and the annular groove 4 in which the inner wall of the gripper 3 engages around the shaft 2 without play so that the shaft 2 is centered accurately with respect to the shaft axis. As a result of the axial contact pressure on the stop 7, the gripper 3 is secured in its angular position with respect to the shaft 2, so that the gripper axis and the shaft axis can be aligned accurately with one another.

These components 8 to be gripped are sucked onto the lower end of the gripper 3. The component 8 is then surveyed, using a camera, in terms of its relative position with respect to the gripper 3 tip and is then rotated in accordance with measured values. If the gripper axis deviates from the shaft axis, then there is a corresponding positional displacement which reduces the placement accuracy. As a result of the accurate mounting of the gripper 3 on the shaft 2, this deviation is reduced to a minimum.

For the purposes of promoting an understanding of the principles of the invention, reference has been made to the preferred embodiments illustrated in the drawings, and specific language has been used to describe these embodiments. However, no limitation of the scope of the invention is intended by this specific language, and the invention should be construed to encompass all embodiments that would normally occur to one of ordinary skill in the art. The particular implementations shown and described herein are illustrative examples of the invention and are not intended to otherwise limit the scope of the invention in any way. For the sake of brevity, conventional electronics, control systems, software development and other functional aspects of the systems (and components of the individual operating components of the systems) may not be described in detail. Many alternative or additional functional relationships, physical connections or logical connections may be present in a practical device. Moreover, no item or component is essential to the practice of the invention unless the element is specifically described as "essential" or "critical". Numerous modifications and adaptations will be readily apparent to those skilled in this art without departing from the spirit and scope of the present invention.

REFERENCE SYMBOLS

1 Fitting head
2 Shaft
3 Gripper
4 Annular groove
5 Locating sphere
6 Locating groove
7 Stop
8 component
9 centering section

What is claimed is:

1. A device for holding a gripper for an electrical component on a fitting head, comprising:
   a substantially cylindrical shaft of the fitting head, comprising:
      a locator configured to project radially from the shaft and configured as peripherally distributed fixed locating metallic spheres relatively permanently connected to the shaft, the shaft configured to accept the gripper at an end section of the shaft in an axial direction such that the gripper is detachably fixed to the shaft; and
      a stop against which the gripper is pressed in the axial direction, the gripper further comprising:
      a hollow cylindrical centering section in an area of the shaft and resting on the shaft; and
      a radiused annular locating groove located in the centering section, the groove configured to engage the shaft locator when the gripper is pressed against the stop, and the outside diameter of the groove being offset axially from the radial extent of the locator when the gripper is pressed in the axial direction against the stop of the shaft to thereby apply axial gripping force to the gripper.

2. The device as claimed in claim 1, further comprising:
   a shaft annular groove of the shaft; and
   wherein the metallic locating spheres are configures to be inserted into and affixed to the shaft annular groove.

3. The device as claimed in claim 2, wherein the locating spheres are designed as steel spheres for ball bearings and are configured to be fixed in the shaft annular groove.

4. The device as claimed in claim 3, further comprising a sealing material lining the shaft annular groove.

5. The device as claimed in claim 4, wherein the sealing material is silicon rubber.

6. The device as claimed in claim 2, further comprising an adhesive bonding material for affixing the locating spheres to the shaft annular groove.

7. The device as claimed in claim 1, and wherein
   the hollow cylindrical centering section of the gripper in a fixing area configured to engage around the shaft from the outside includes an annular wall, a wall thickness of the annular wall being so low that it deforms under stress of the locating spheres during the pressing of the gripper in the axial direction.

8. A method of attaching a gripper for an electrical component to a fitting head, comprising:
   sliding the gripper onto an end of a cylindrical shaft of the fitting head in the direction of the shaft axis until a distal end of the gripper opposite a proximal head that touches the component rests up against a stop of the shaft, thereby engaging the gripper with a locator that projects radially from the shaft, and is configured as peripherally distributed fixed locating metallic spheres relatively permanently connected to the shafts into a radiused annular locating groove of the gripper whose outside diameter is offset axially from a radial extent of the locator when the gripper is pressed in the axial direction against the stop to thereby apply axial gripping force to the gripper.

* * * * *